(12) United States Patent
Ratzlaff

(10) Patent No.: US 7,970,591 B1
(45) Date of Patent: Jun. 28, 2011

(54) USING IMPEDANCE (Z) PARAMETERS TO AUGMENT CIRCUIT SIMULATION

(75) Inventor: Curtis L. Ratzlaff, Austin, TX (US)

(73) Assignee: Nascentric, Inc., Austin, TX (US)

( * ) Notice: Subject to any disclaimer, the term of this patent is extended or adjusted under 35 U.S.C. 154(b) by 391 days.

(21) Appl. No.: 12/169,277

(22) Filed: Jul. 8, 2008

(51) Int. Cl.
*G06F 17/50* (2006.01)
(52) U.S. Cl. .............................. 703/2; 703/14; 716/106
(58) Field of Classification Search ............... 703/2, 14; 716/106, 136
See application file for complete search history.

(56) References Cited

U.S. PATENT DOCUMENTS

2008/0140379 A1* 6/2008 Shah et al. ...................... 703/14

OTHER PUBLICATIONS

Gabriel Kron, "A Method of Solving Very Large Physical Systems in Easy Stages," Proceedings of the IRE, Apr. 1954, pp. 680-686.
Curtis L. Ratzlaff, et al., "RICE: Rapid Interconnect Circuit Evaluation Using AWE," IEEE, 1994, pp. 763-776.

* cited by examiner

*Primary Examiner* — Thai Phan
(74) *Attorney, Agent, or Firm* — Holland & Knight LLP; Brian J Colandreo, Esq.; Mark H Whittenberger, Esq.

(57) ABSTRACT

In one embodiment, a method for simulating an electric circuit that is represented as one or more partitions, each partition comprising a plurality of constituents representing portions of the circuit, wherein at least one of the constituents is a variable constituent for which the corresponding portion of the electronic circuit includes non-linear behavior, comprises: determining a first matrix for the variable constituent, wherein the first matrix describes a system of equations that represents a behavior of the variable constituent; determining a second matrix for the partition, wherein the second matrix permits calculation of short circuit currents from open circuit voltages according to a node tearing analysis method; and simulating a timestep of the simulation, the simulating comprising iteratively solving a state of the partition using successive guesses of the state of the variable constituent, wherein each iteration comprises solving the variable constituent independently to generate the open circuit voltages using the first matrix, applying the second matrix to determine the short circuit currents, and resolving the variable constituent with the short circuit currents applied and the forcing functions disabled; converging to a solution during the iteratively solving; and solving the partition state for the timestep responsive to the convergence.

19 Claims, 8 Drawing Sheets

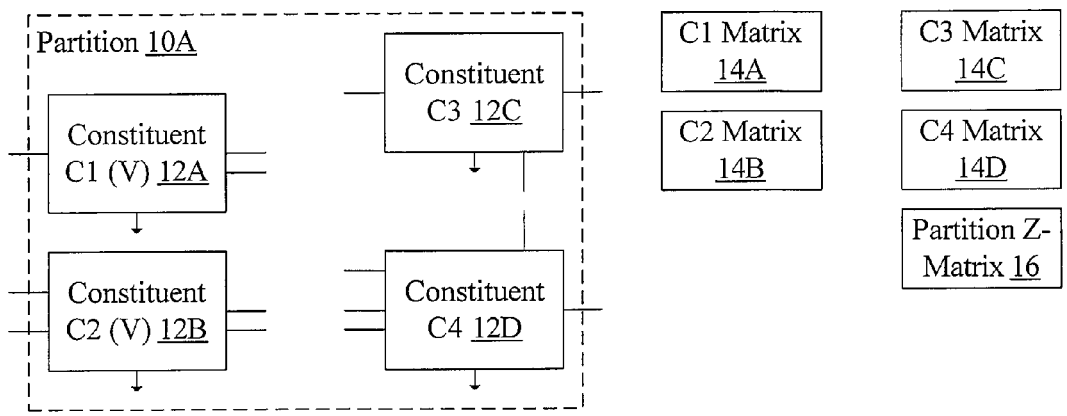
Fig. 2
$$v_{oc} = Z\, i_{sc}$$
$$i_{sc} = Z^{-1}\, v_{oc}$$
Fig. 3
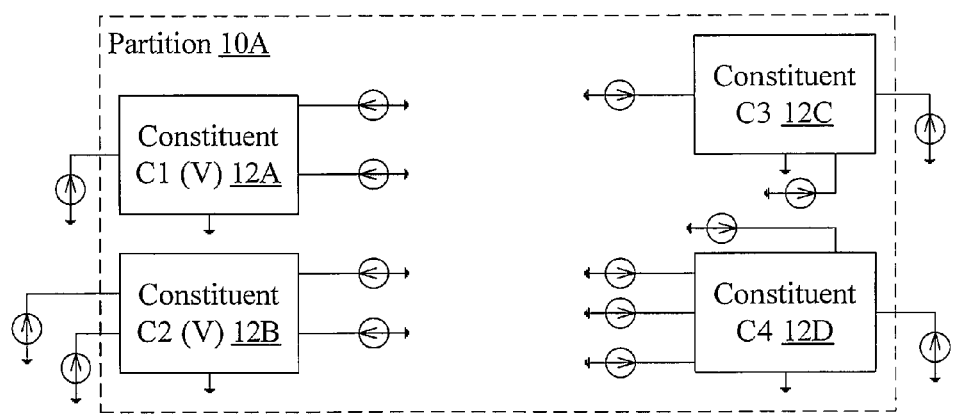
Fig. 4

USING IMPEDANCE (Z) PARAMETERS TO AUGMENT CIRCUIT SIMULATION

BACKGROUND

1. Field of the Invention

This invention is related to the field of electric circuit simulation.

2. Description of the Related Art

Circuit simulation tools provide a way for the circuit designer to simulate the behavior of a complex design, identify any problems, and make alterations and enhancements to the circuit before arriving at a final design. That iterative design process has in turn improved the reliability of the end products that incorporate a given circuit design. One of the most popular circuit simulation tools is the Simulation Program with Integrated Circuit Emphasis (or SPICE). Many commercial versions of SPICE are available.

Circuit simulation typically involves the generation of a system of simultaneous equations that define the electrical behavior of the circuit. For example, SPICE is predominantly a Kirckhoffs Current Law (KCL) solver that generates a system of equations according to KCL to represent the circuit behavior. The system of equations may represent linear elements (such as resistors, capacitors, and inductors) as well as nonlinear elements such as transistors. If the circuit includes nonlinear elements (whose state depends on other state in the system, and whose state may affect such other state), a nonlinear solver is employed. In SPICE, the equations governing nonlinear elements are required to be have continuous first derivatives and non-zero second derivatives, so that Newton-Raphson methods can be used in the nonlinear solver. Other nonlinear solvers exist as well (e.g. secant; Broyden, Fletcher, Goldfarb, and Sanno (BFGS); Davidon-Fletcher-Powell (DFP); etc.).

Generally, circuit simulators use the nonlinear solver to generate "guesses" (estimates of the possible solution) for every variable in the system of equations. The solution is evaluated using the estimates, and new estimates are generated, until the difference between guesses from iteration to iteration reduces to some desired threshold.

Since new estimates are calculated for every variable, and the system of equations is re-evaluated for the estimates, the amount of computation time and memory consumed to simulate a circuit of any complexity is generally large. For numerical methods such as BFGS and DFP, the matrices used to solve the system of equations may be more densely populated than the sparse matrices often found for systems in which nonlinear elements have the requirements for using Newton-Raphson. In such numerical methods, the computation time and memory consumption may increase even more rapidly than Newton-Raphson iteration (e.g. according to the square of the number of nodes in the circuit rather than linearly).

SUMMARY

In one embodiment, a method for simulating an electric circuit that is represented as one or more partitions is contemplated. Each partition comprises a plurality of constituents representing portions of the circuit, wherein at least one of the constituents is a variable constituent for which the corresponding portion of the electronic circuit includes non-linear behavior. The method comprises determining a first matrix for the variable constituent, wherein the first matrix describes a system of equations that represents a behavior of the variable constituent. The method further comprises determining a second matrix for the partition, wherein the second matrix permits calculation of short circuit currents from open circuit voltages according to a node tearing analysis method. The method further comprises simulating a timestep of the simulation, the simulating comprising iteratively solving a state of the partition using successive guesses of the state of the variable constituent. Each iteration comprises solving the variable constituent independently to generate the open circuit voltages using the second matrix for the variable constituent, applying the first matrix to the partition to determine the short circuit currents, and resolving the variable constituent with the short circuit currents applied and with internal forcing functions disabled. The simulating of the timestep further comprises converging to a solution during the iteratively solving; and solving the partition state for the timestep responsive to the converging. A computer accessible storage medium storing instructions which, when executed on a computer, implement the method is also contemplated, as is the computer that executes the instructions to perform a simulation.

BRIEF DESCRIPTION OF THE DRAWINGS

The following detailed description makes reference to the accompanying drawings, which are now briefly described.

FIG. 2 is a block diagram of one embodiment of a partition in greater detail, with connections between constituents broken so that each constituent is independent.

FIG. 3 illustrates equations that relate open circuit voltages and short circuit currents according to a node tearing circuit analysis method.

FIG. 4 is a block diagram of one embodiment of the partition with current sources inserted on each constituent connection.

Figure 1:
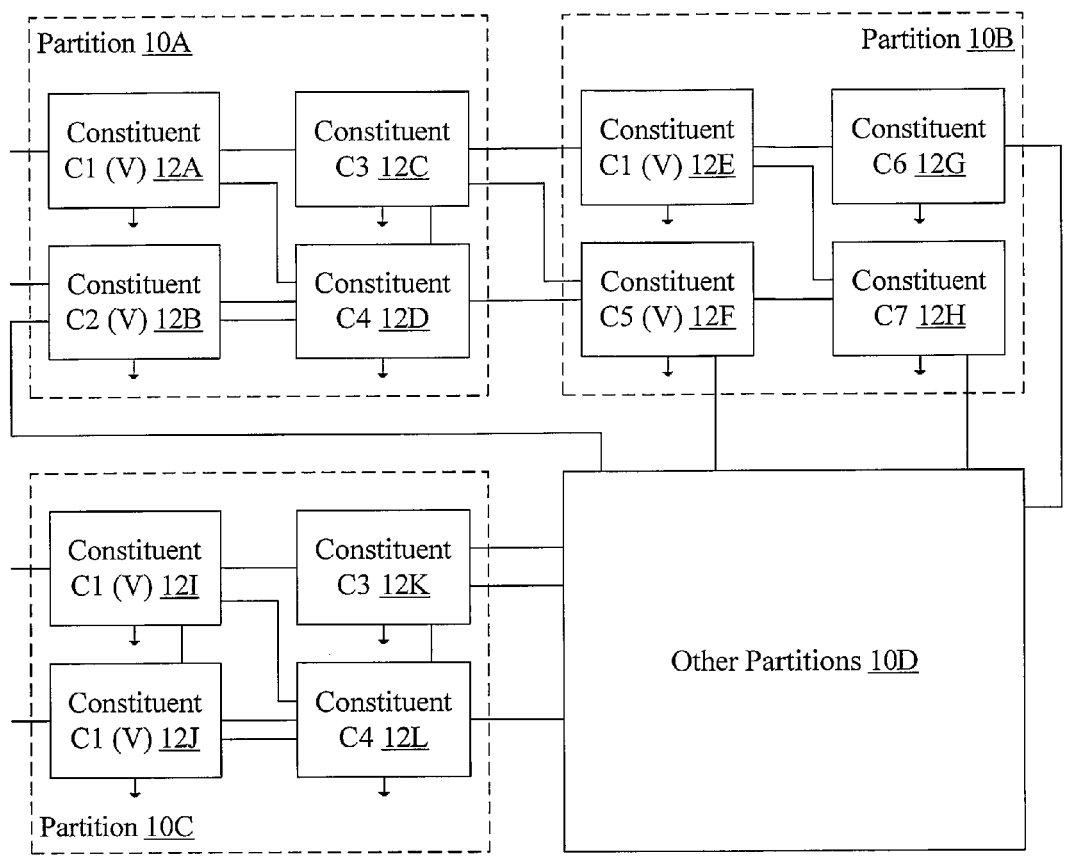
FIG. 1 is a block diagram of one embodiment of partitions that represent an electric circuit to be simulated.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of a representation of an electric circuit to be simulated is shown. The representation is divided into multiple partitions 10A-10D, where partition 10D may be one or more other partitions. Partitions 10A-10C are illustrated in greater detail. For example, partition 10A includes constituents 12A-12D; partition 10B includes constituents 12E-12H; and partition 10C includes constituents 12I-12L. The other partitions 10D may include additional constituents, not shown. In general, each partition comprises at least one constituent and may comprise a plurality of constituents. In general, a circuit is represented by one or more partitions. The representation may be described in any fashion (e.g. SPICE input files, sometimes called SPICE decks; other circuit simulation input files; schematics in a schematic capture or schematic drawing program; high level design language (HDL) descriptions with corresponding cell libraries; netlists; etc.).

Accordingly, each partition 10A-10D corresponds to a portion of the circuit to be simulated (or all of the circuit, if only one partition is included). The constituents each correspond to a non-overlapping portion of the circuit that is assigned to the partition. That is, collectively, the constituents within a partition represent the portion of the circuit that corresponds to that partition. Accordingly, a constituent represents a portion of the overall circuit.

The partitions may be determined by analyzing the circuit to be simulated, and by grouping tightly coupled portions of the circuit together. Circuitry may be tightly coupled to other circuitry if the circuitry includes a large number of interconnections with the other circuitry, for example. In some embodiments, the partitions may be selected to attempt to minimize the number of inter-partition connections. Additionally, in some embodiments, circuitry may be tightly coupled to other circuitry if it is physically located near the other circuitry. A combination of mechanisms for determining tightly coupled may be used. The partitioning may be performed manually by the circuit designer or test engineer, by one or more computer aided design programs used in the design processor, or by the circuit simulator.

Constituents may be defined similar to partitions (although the number of connections between constituents may be higher than the number of connections between partitions). The constituents may also be defined with an attempt to reuse the same constituent more than one time in the design. For example, in FIG. 1, the designations C1, C2, etc. to C7 designate different constituent contents, where the same label on two constituents indicates that the contents of the constituent are the same, but the connections are different (i.e. the constituents are different instances of the same instance content). In FIG. 1, constituents 12A, 12E, 12I, and 12J are instances of the same constituent (C1). Similarly, constituents 12C and 12K are instances of constituent C3, and constituents 12D and 12L are instances of constituent C4. Instances of the same constituent content may share resources. For example, the circuit simulator may generate matrices representing the system of equations that describes the behavior of each constituents. Instances with the same constituent content may use the same matrix. Additionally, an embodiment below generates a matrix (referred to as the Z-matrix) for the partition for use in a node tearing circuit analysis method.

In one embodiment, constituents may correspond to components that are available to the circuit designer. For example, a constituent may correspond to a predefined cell in a cell library; a subcircuit defined by the designer knowing that the will be reused, etc.

As illustrated in FIG. 1, each of the constituents 12A-12L have the same ground connection. For at least those constituents in a given partition for which the node tearing analysis method is used, the same ground reference is used. Different ground references may be used in different partitions (or different groups of constituents for which node tearing is applied) as desired.

In the present embodiment, there are two types of constituents: variable and non-variable. Other embodiments may include more types of constituents, as desired. Variable constituents are labeled with a parenthetical "V" in FIG. 1 (e.g. constituents 12A-12B, 12E-12F, and 12I-12J). Non-variable constituents do not include the parenthetical "V" in FIG. 1 (e.g. constituents 12C-12D, 12G-12H, and 12K-12L). Variable constituents correspond to circuit portions that include non-linear behavior. For example, the circuit portion may include transistors, or non-linear modeling elements that correspond to circuit elements. The variable constituents may be linearized for a given timestep, and in some cases the linearization may differ for different time steps. However, the underlying behavior may still be non-linear. Not every circuit element corresponding to a variable constituent need exhibit non-linear behavior, but at least one does. Non-variable constituents correspond to circuit portions that do not include non-linear behavior. For example, non-variable constituents may represent interconnect or groups of passive elements (e.g. resistor, capacitor, and inductor elements) in a circuit.

While the variable constituents may have been linearized for a timestep, values within the constituent may be dependent on the non-linear behavior and thus a non-linear solver may still be used in the circuit simulation. For example, in one embodiment, metal-oxide-semiconductor (MOS) transistors are modeled as a set of capacitances between the transistor's terminals, and a current source between the source and drain terminals. The current source may have a current that is derived from a table of currents (based on one or more of the terminal voltages). Additional details will be provided further below.

In general, each constituent may have one or more connections to other constituents (either in the same partition or a different partition, although connections that exit the partition may be treated differently in some ways, as described below). Variable constituents may have connections to non-variable constituents, or vice versa. Similarly, variable constituents may have connections to other variable constituents, and non-variable constituents may have connections to other non-variable constituents. An illustrative connection of constituents is shown in FIG. 1, but in general any number of connections between constituents, and between partitions, may exist in various embodiments. A connection point on a constituent (to which a connection to one or more other constituents may be made) is referred to as a "terminal" of the constituent.

The simulator described herein uses the node tearing circuit analysis mechanism to simulate the constituents of a partition. Originally developed by Gabriel Kron, the node tearing analysis mechanism includes breaking certain connections in a circuit, creating subcircuits for which the connections to other subcircuits have all been broken (i.e. they are open circuits). Thus, each subcircuit is independent of the other subcircuits. The state of each subcircuit is solved with the open circuits in place, generating a set of node voltages on the open circuit inputs and outputs (referred to as the open circuit voltages). The open circuit voltages are used to derive a set of short circuit currents that would have flowed in the overall circuit if the connections were not open circuits (based on the node voltages that resulted from the open circuit analysis). A matrix (the Z-matrix) may be used to relate the open circuit voltages of a given subcircuit to the short circuit currents of that given subcircuit, where the Z-matrix is determined based on the impedance looking into the subcircuit for each open circuit connection. The short circuit currents are applied to the open circuit connections of each subcircuit, and the subcircuits are re-solved to generate the correct solution for overall circuit. Kron proved that this method produces correct results for the overall circuit.

Using the node tearing circuit analysis technique, the simulator may isolate the variable constituents in a partition. The variable constituents may be iteratively solved, using guesses from the non-linear solver, independent from the non-variable constituents. Once a solution has converged for the variable constituents, the non-variable constituents may be solved and the overall solution for the partition is determined. In one embodiment, the node tearing circuit analysis method may be used for the non-variable constituents as well. Accordingly, if K iterations would be required for the non-linear solver to generate a result for a timestep, then 2*K linear solves per timestep are performed for the variable constituents and 2 solves are performed for the non-variable constituents (one at the beginning of the first iteration for the variable constituents and one after the last iteration for the variable constituents. K may typically be between 2 and 5, for example. For large linear networks coupled to non-linear components, computational effort may be significant decreased.

FIG. 2 illustrates the partition 10A after the connections between the constituents 12A-12D have been broken. As can be seen, each of the constituents 12A-12D may be simulated independently, since the terminals are open circuit, to generate the open circuit voltages. Additionally illustrated in FIG. 2 are the matrices for each of the constituents 12A-12D (matrices 14A-14D). Each matrix 14A-14D describes a system of equations that represents the behavior of the corresponding constituent 12A-12D. As mentioned previously, matrices may be shared among constituents that are instances of the same content (e.g. the C1 matrix 14A may be shared by the constituents 12A, 12E, 12I, and 12J). The matrices 14A-14D may be referred to as solution matrices.

In addition to the matrices 14A-14D, Z parameters may be determined for each constituent 12A-12D for use with the node tearing circuit analysis method. FIG. 3 illustrates the equations that relate the open circuit voltages ($v_{oc}$) and the short circuit currents ($i_{sc}$), where the open circuit voltages and short circuit currents are vectors having an element for each terminal for a constituent (where a terminal is a connection point that may be connect to one or more other constituents), and Z is a matrix of parameters that are related to the impedance at each terminal. $Z^{-1}$ is the inverse of the Z matrix, and may be formed if Z is non-singular. Various mechanisms for effectively performing the inversion (whether or not the inversion is actually performed) may be used in various embodiments. The Z parameters may be determined in a variety of fashions. For example, in one embodiment, a one amp test current may be applied to each terminal with the independent current and voltage sources within the constituent set to zero. With the one amp test current applied, the voltage at each terminal is measured. The ratio of the voltage to the test current is the Z parameter. The Z parameters for a one amp test current in a given terminal "i" would form the "i"th row of the Z matrix. Because the matrix is symmetric, the Z parameters would also form the "i"th column. In one embodiment, the Z matrix for each constituent is not formed. Instead, a partition Z matrix 16 is determined by stamping the Z parameters determined via the test currents into the partition Z matrix (adding the parameter to any value already there). By forming the partition Z matrix instead of Z matrices for the constituents, less storage space may be used for the Z matrices.

After solving the constituents independently in the open circuit condition and determining the short circuit currents, the short circuit currents may be applied to the open circuit models as current sources (e.g. as shown in FIG. 4). Conceptually, the constituents may be re-solved to determine the solution. In the present embodiment, the Z matrix for the partition is used as described in more detail below.

Figure 5:
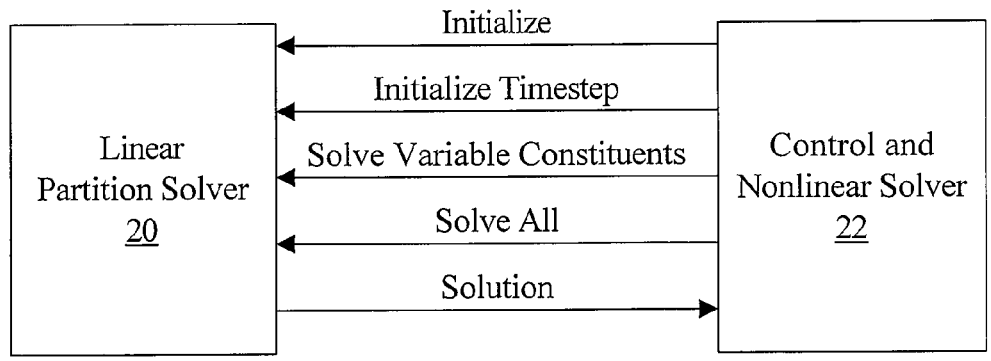
FIG. 5 is a block diagram of one embodiment of a linear partition solver and a control and nonlinear solver.

FIG. 5 is a block diagram of one embodiment of a simulator that may be used to simulate the circuit of FIG. 1. The simulator may include a control and nonlinear solver module 22 and a linear partition solver module 20. Each of the modules 20-22 may comprise instructions which, when executed on a computer, cause the computer to perform the operations described herein for the modules. While the modules 20-22 are shown separately in FIG. 5, the modules may be integrated into a single module as well. In some embodiments, multithreaded execution may be implemented and there may be a linear partition solver thread for each partition. There may also be separate threads for each constituent in a partition, to solve the constituents in parallel.

Generally, the control and nonlinear solver 22 may include overall simulation control functionality, and may include the nonlinear solver functionality. Any nonlinear solver may be used, such as Newton-Raphson, BFGS, DFP, secant, etc. The linear partition solver 20 may include functionality to solve a partition, e.g. using the node tearing analysis mechanism as described above.

The arrows between the linear partition solver 20 and the control and nonlinear solver 22 may indicate the communications back and forth between the modules. The control and nonlinear solver 22 may make calls to the linear partition solver 20, which may return values in response to the calls. Alternatively, the values may be passed back and forth in data structures in memory. The simulator may be object oriented, and the various "calls" may be method invocations. Any software constructs and/or communication mechanisms may be used in various embodiments. For simplicity, the communications from the control and nonlinear solver 22 may be referred to as requests or commands, and the communications from the linear partition solver 20 may be referred to as results.

At the beginning of the simulation, the control and nonlinear solver 22 may initialize the linear partition solver 20 with the initialize command. The control and nonlinear solver 22 may pass the location of the partition description files, so that the linear partition solver 20 may generate the constituent matrices and partition Z matrix, and any other data that may be used in various embodiments.

The simulation may be time based (i.e. the output may be determined as a function of time). The amount of time that elapses between points at which the circuit is solved is referred to as a timestep, and may vary from timepoint to timepoint based on the desired accuracy, the rate at which voltages and/or currents are changing, etc. In some cases, the model for a constituent or constituents may change between timesteps (e.g. if the timestep changes size). An initialize timestep command may be used to cause such changes, or any other initializations that may be desired at the beginning of a timestep. Additionally, the linear partition solver 20 may determine an initial solution of the partition for the timestep in response to the initialize timestep command. The linear partition solver 20 may return the initial solution to the control and nonlinear solver 22 ("solution" in FIG. 5).

The control and nonlinear solver 22 may generate guesses for the variable constituent's state (e.g. node voltages or currents), and may use a solve variable constituents command to cause the linear partition solver 20 to solve the partition for the new guesses. The linear partition solver 20 may return the solution to the control and nonlinear solver 22. In one embodiment, only the variable constituent's portion of the solution may be changed by the linear partition solver 20 during the iterations of the variable constituent guesses. The partition may be solved iteratively, with new guesses for the variable constituents, until the guesses converge on a solution. In one embodiment, the guesses may be passed to the linear partition solver 20, and the solution may be passed to the control and nonlinear solver 22, through memory data structures. Once the guesses has converged, a solve all command may be used to request that the linear partition solver 20 solve all constituents, and the linear partition solver 20 may provide the complete solution for the timestep.

Figure 6:
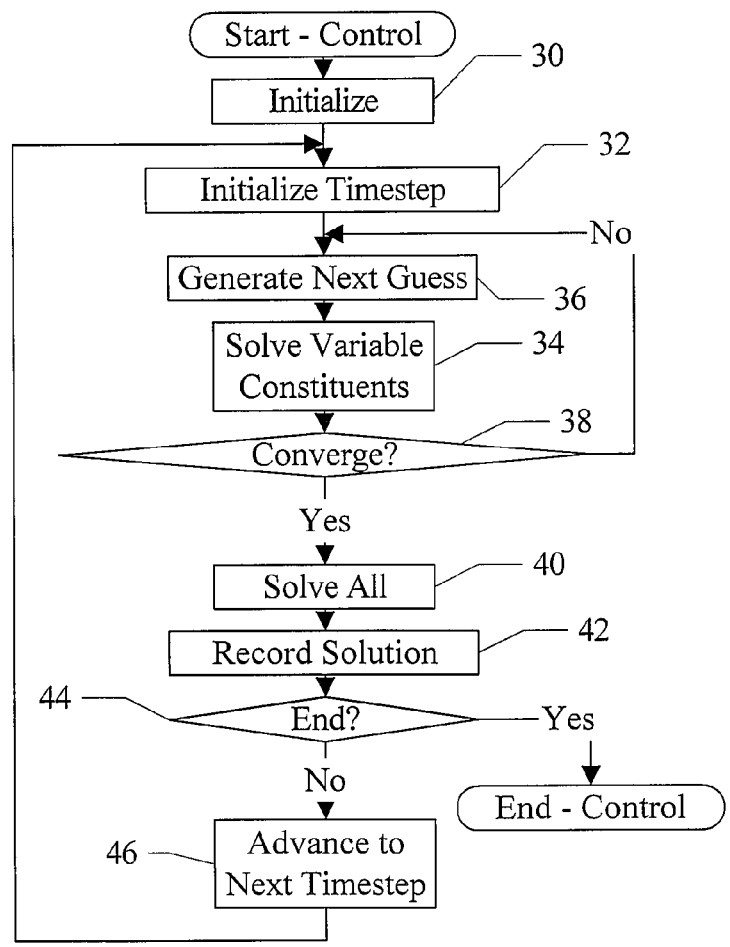
FIG. 6 is a flowchart illustrating operation of one embodiment of the control and nonlinear solver.

Turning now to FIG. 6, a flowchart is shown illustrating operation of one embodiment of the control and nonlinear solver 22 during a simulation. While the blocks are shown in a particular order for ease of understanding, other orders may be used. The control and nonlinear solver 22 may include instructions which, when executed, implement the operation illustrated in FIG. 6.

The control and nonlinear solver 22 may initialize the simulation (block 30). Initializing the simulation may include sending the initialize command to the linear partition solver 20 (or each instance thereof, if different instances are used for different partitions). Additionally, the control and nonlinear solver 22 may initialize its own data structures (e.g. matrices for use by the nonlinear solver algorithm to generate guesses for the variable constituents). The control and nonlinear solver 22 may transmit the initialize timestep command to the linear partition solver 20 (block 32) to perform timestep-specific initializations. For example, if a different model is used for a variable constituent in the timestep, the control and nonlinear solver 22 may identify the model to be used for the linear partition solver 20. Additionally, the linear partition solver 20 may generate an initial solution of the partition for the timestep, and may provide the initial solution to the control and nonlinear solver 22.

The control and nonlinear solver 22 may iteratively generate a next guess for the variable constituent state variables (e.g. node voltages, currents, etc.) (block 36), send the solve variable constituents command to the linear partition solver 20 (block 34), and determine if the solution has converged by comparing the solution provided by the linear partition solver 20 to the most recent solution (decision block 38). If the solution has not converged (decision block 38, "no" leg), another iteration is performed.

If the solution has converged (decision block 38, "yes" leg), the control and nonlinear solver 22 may transmit the solve all command to the linear partition solver 20 (block 40). The linear partition solver 20 may generate the solution for the partition, and the control and nonlinear solver 22 may record the solution for the timestep (block 42). For example, the solution may be recorded in an output file, which may subsequently be displayed for a user to review the results of the simulation. If the simulation has ended (decision block 44, "yes" leg), the control and nonlinear solver 22 may exit. The simulation has ended if the current timestep is the last timestep specified in the simulation control file provided to the simulator, for example. That is, the simulation time has reached the end time for the simulation, e.g. as specified by the user.

If the simulation has not ended (decision block 44, "no" leg), the control and nonlinear solver 22 may advance to the next timestep (block 46). The control and nonlinear solver 22 may transmit the initialize timestep command (block 32), and the control and nonlinear solver 22 may return to iterating guesses for the variable constituents and converging to a solution for the next timestep (blocks 34, 36, and 38).

It is noted that, in some embodiments, the simulator may determine after a specified number of iterations of the variable constituents without convergence, that the timestep is to be modified (e.g. shortened) in an attempt to attain convergence. In such a case, the flowchart may include a check after the converge check (decision block 38) on the "no" leg of the convergence check that changes the timestep and returns to the initialize timestep block (block 32) if convergence has not been attained and the specified number of iterations has been performed. Other embodiments may detect non-convergence in other fashions (e.g. widening of the differences between guesses, oscillation in the guesses, etc.).

Figure 7:
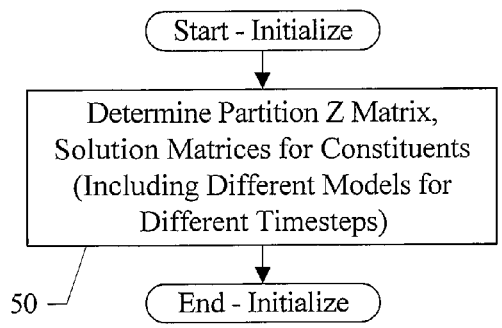
FIG. 7 is a flowchart illustrating operation of one embodiment of the linear partition solver for initialization.

Turning now to FIG. 7, a flowchart is shown illustrating operation of one embodiment of the linear partition solver 20 in response to an initialize command from the control and nonlinear solver 22. While the blocks are shown in a particular order for ease of understanding, other orders may be used. The linear partition solver 20 may include instructions which, when executed, implement the operation illustrated in FIG. 7.

The linear partition solver 20 may determine the Z matrix for the partition and the solution matrices for the constituents in the partition (block 50). If more than one timestep size may be used, or more than one model for a variable constituent is used at different times in the simulation, the partition Z matrix and solution matrices for each possible model may be determined. The linear partition solver 20 may save the matrices for use during the simulation.

In one embodiment as mentioned above, the Z matrix for a partition may be determined by applying a test current to the terminals of each constituent, simulating the constituent with all internal sources or other internal forcing functions of the constituent set to zero (or "turned off" or "disabled"), and measuring the voltages on the terminals. The ratio of the measured voltage to the test current indicates the impedance. The test current may be a one amp test current, and the voltage measured on the terminal is its impedance. In one embodiment, the simulation may be performed one terminal at a time over all the terminals of the constituents in the partition. Because the constituents are linear (or linearized for the timestep), the principle of superposition may be used to sum the impedances of each terminal from each test current to form the elements of the partition Z matrix. Similar to the solution matrices, the impedance at a given row and column of the partition Z matrix corresponds to one of the terminals, and can be populated with the measured impedances on the other terminals when the test current is applied to that terminal.

Figure 8:
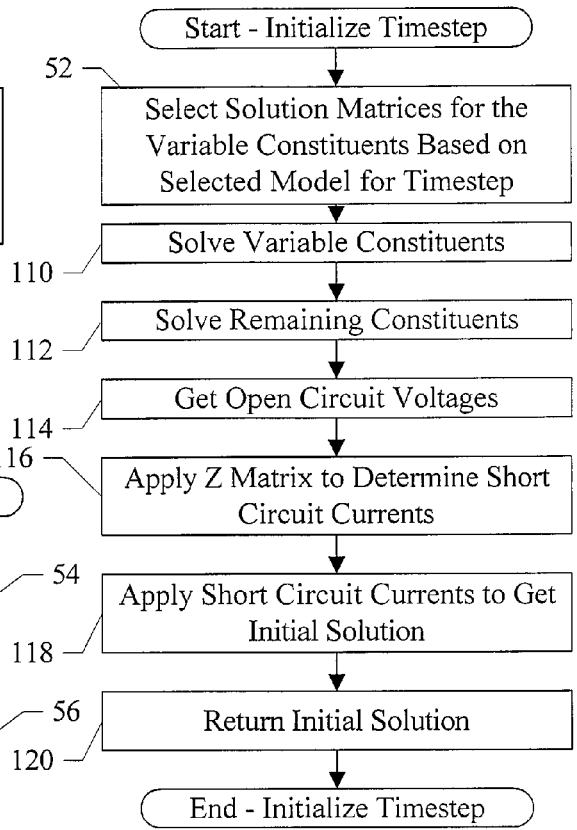
FIG. 8 is a flowchart illustrating operation of one embodiment of the linear partition solver for timestep initialization.

Turning now to FIG. 8, a flowchart is shown illustrating operation of one embodiment of the linear partition solver 20 in response to an initialize timestep command from the control and nonlinear solver 22. While the blocks are shown in a particular order for ease of understanding, other orders may be used. The linear partition solver 20 may include instructions which, when executed, implement the operation illustrated in FIG. 8.

The linear partition solver 20 may select the partition Z matrix (and solution matrices) based on the selected model for the timestep (block 52). The control and nonlinear solver 22 may identify the selected model in any given fashion. For example, the control and nonlinear solver 22 may provide a pointer to a data structure describing the selected model. The control and nonlinear solver 22 may provide the selected timestep, which may indicate the selected model indirectly. Any mechanism may be used, in various embodiments.

The linear partition solver 20 may solve the variable constituents (block 110) and the remaining (non-variable) constituents (block 112). The linear partition solver 20 may obtain the open circuit voltages from the solution for both the variable and non-variable constituents (block 114), and apply the partition Z matrix to determine the short circuit currents (block 116). The linear partition solver 20 may apply the short circuit currents to obtain the initial solution (block 118), and may return the initial solution to the control and nonlinear solver 22.

Figure 9:
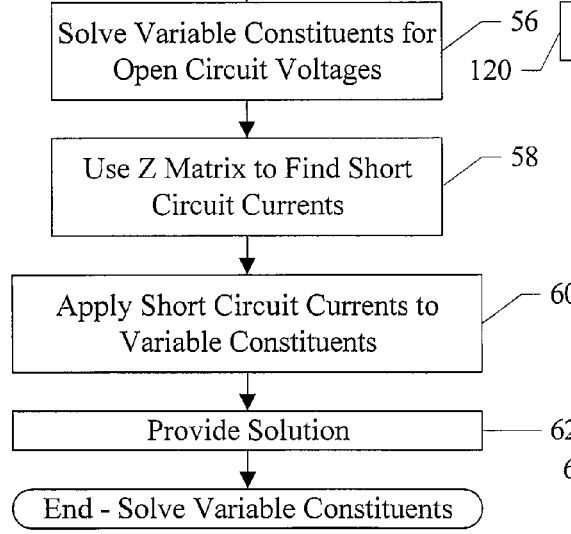
FIG. 9 is a flowchart illustrating operation of one embodiment of the linear partition solver for solving the variable constituents of a partition.

Turning now to FIG. 9, a flowchart is shown illustrating operation of one embodiment of the linear partition solver 20 in response to a solve variable constituents command from the control and nonlinear solver 22. While the blocks are shown in a particular order for ease of understanding, other orders may be used. The linear partition solver 20 may include instructions which, when executed, implement the operation illustrated in FIG. 9.

The linear partition solver 20 may apply the new guess for the variable constituents supplied by the control and nonlinear solver 22 (block 54). The linear partition solver 20 may solve the variable constituents in the open circuit case (e.g. as shown in FIG. 2) using the solution matrices for the variable constituents (block 56) and the new guesses. The linear partition solver 20 may use the partition Z matrix and the open circuit voltages (including the newly determined open circuit voltages for the variable constituents and the open voltages for the nonvariable constituents that were determined in the initialization) to determine the short circuit currents (block 58). The linear partition solver 20 may apply the short circuit currents to the variable constituents (e.g. similar to FIG. 4) and may resolve the variable constituents to determine the solution (block 60). The linear partition solver 20 may provide the solution to the control and nonlinear solver 22 (block 62). In one embodiment, the open circuit solution (block 56) may be generated and stored in the memory location at which the final solution (block 60) will be stored. The short circuit currents may be applied to the constituent without any internal stimuli or biases, and the solution found for the short circuit currents may be algebraically added to the open circuit solution to produce the final result.

Figure 10:
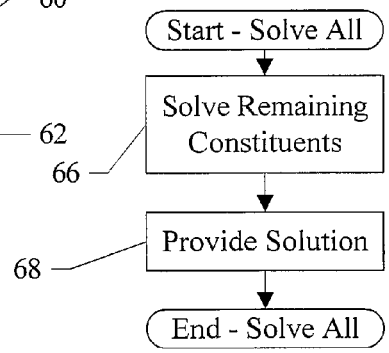
FIG. 10 is a flowchart illustrating operation of one embodiment of the linear partition solver for solving all constituents of a partition.

Turning now to FIG. 10, a flowchart is shown illustrating operation of one embodiment of the linear partition solver 20 in response to a solve all command from the control and nonlinear solver 22. While the blocks are shown in a particular order for ease of understanding, other orders may be used. The linear partition solver 20 may include instructions which, when executed, implement the operation illustrated in FIG. 10.

The linear partition solver 20 has previously solved the variable constituents. Accordingly, the linear partition solver 20 may only solve the nonvariable constituents in response to the solve all command. The linear partition solver 20 may solve the remaining (non-variable) constituents (block 66). The linear partition solver 20 may use the same node tearing circuit analysis method described above. The linear partition solver 20 may provide the partition solution (including both the variable and the non-variable constituents) to the control and nonlinear solver 22 (block 68).

Figure 11:
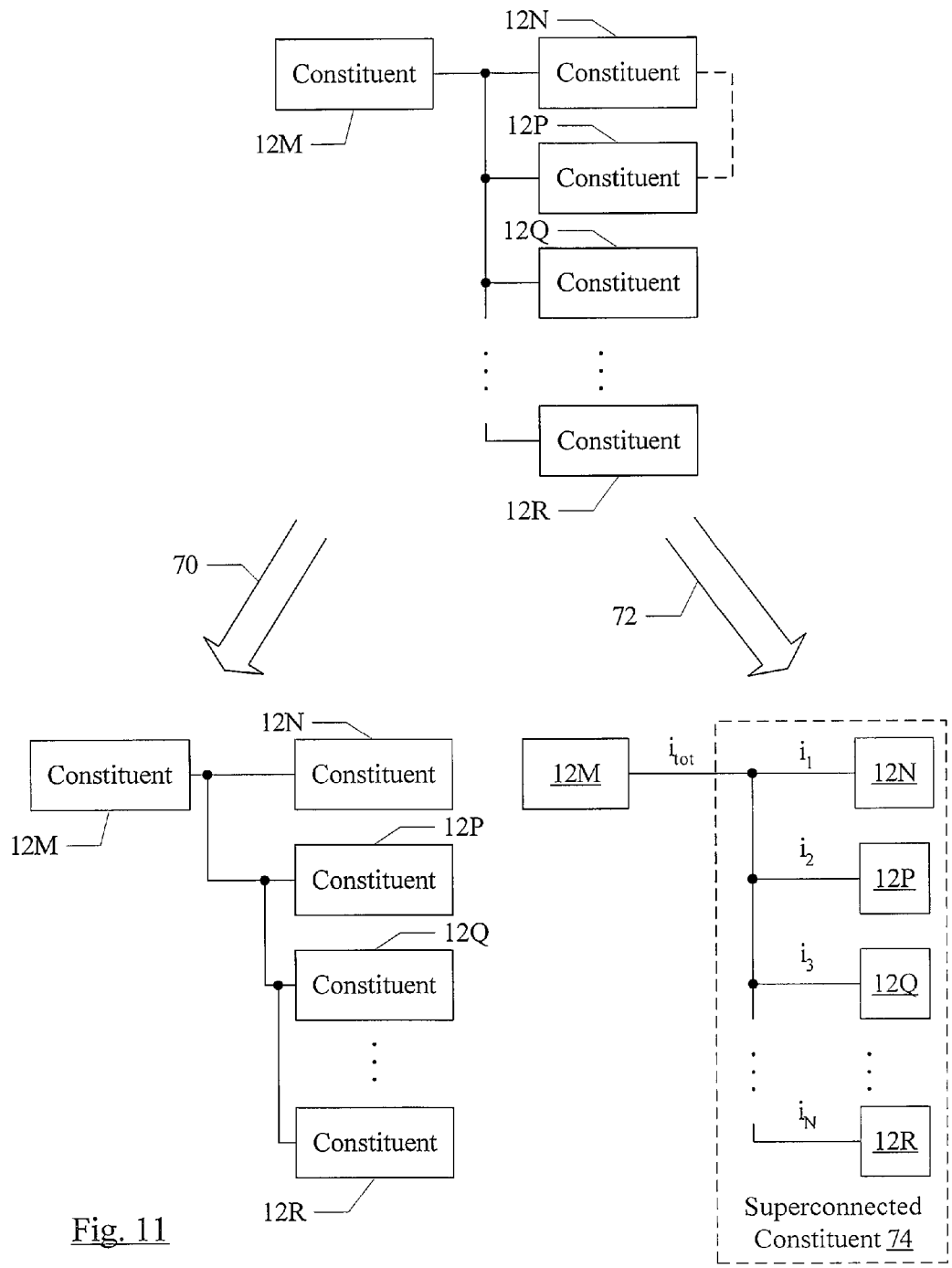
FIG. 11 is a block diagram illustrating one embodiment of constituents and a connection from one constituent to multiple other constituents, and modeling options for the constituents.

While the examples considered so far have illustrated a connection from one constituent to one other constituent, in general a constituent may have a terminal that is connected to terminals of multiple constituents. For example, FIG. 11 illustrates such a terminal of a constituent 12M that is connected to multiple other constituents such as 12N, 12P, 12Q, and 12R. These connections will be referred to as "superconnected" connections, or a superconnected node.

The constituents 12N, 12P, 12Q, and 12R may be "single ended" in which the superconnected node is connected to logic in the constituents that flows "forward" without any feedback within the constituents or between the constituents. Alternatively, feedback may be provided within a constituent, creating a "loop" that impacts the current drawn by that constituent, or there may be looping connections between constituents (e.g. the dotted line between the constituents 12N and 12P) that impacts the current drawn by the constituents.

The linear partition solver 20 may implement at least two possible models for the superconnected node. The two possible models are indicated by arrows 70 and 72 in FIG. 11, respectively. The model indicated by arrow 70 will be referred to herein as the "single sink" model. In the single sink model, the superconnected node is divided into multiple connections, each connected to a different constituent sink. The connections are logically the same (e.g. they may be effectively connected within the constituent source, such as constituent 12M) but are separate connections in the model and thus may be treated like other connections that have termini in only two constituents.

The single sink model provides an accurate simulation for any number of connections of a superconnected node. However, each additional connection to the superconnected node increases the size of the Z matrices used in the linear partition solver 20 (since the size of the Z matrix is based on the number of connections to a given constituent). Thus, the speed of the simulation may be affected by the superconnected nodes. In some cases, there may be a large number of connections to a superconnected node (e.g., nodes within memories may often have hundreds or even thousands of connections).

A potential optimization for such cases is the superconnected constituent model shown at arrow 72. For space reasons, the label "constituent" has been removed from the constituents in the superconnected constituent model, but it is intended that the constituents are essentially the same as the like-numbered constituents at the top of FIG. 11. The superconnected constituent model comprises a superconnected constituent 74 that encompasses the sink constituents 12N, 12P, 12Q, and 12R. A Z matrix and/or solution matrix may be created for the superconnected constituent 74, and the superconnected constituent 74 presents a single connection to the constituent 12M, instead of the multiple connections in the single sink model.

The current supplied from the constituent 12M ($i_{tot}$ in FIG. 11) is distributed among the constituents within the superconnected constituent 74 ($i_1, i_2, i_3, \ldots i_N$ as shown in FIG. 11). The linear partition solver 20 may determine a distribution of the current (e.g. based on the impedances of the constituents within the superconnected node). During the simulation, the current $i_{tot}$ may be solved for and then the current may be distributed to the currents $i_1, i_2, i_3, \ldots i_N$. The constituents solution matrices and/or Z matrices may be used to solve the constituents within the superconnected constituents. In the single ended case, the current distribution may be determined based on the parallel combination of the impedances. However, in the case the loops or other feedback behavior is concerned, the distribution may be somewhat more complex. In general, the linear partition solver 20 may attempt to create the solution matrix for the superconnected constituent 74 and the Z matrix for the partition including the superconnected constituent 74. If the attempt to create the matrices (and the effective inversion thereof) leads to a factorization error, the single sink model may be used. In some embodiments, the linear partition solver 20 may be coded to identify certain cases that are known to frequently result in an error, and the linear partition solver 20 may default such cases to the single sink model without attempting the superconnected constituent 74.

Figure 12:
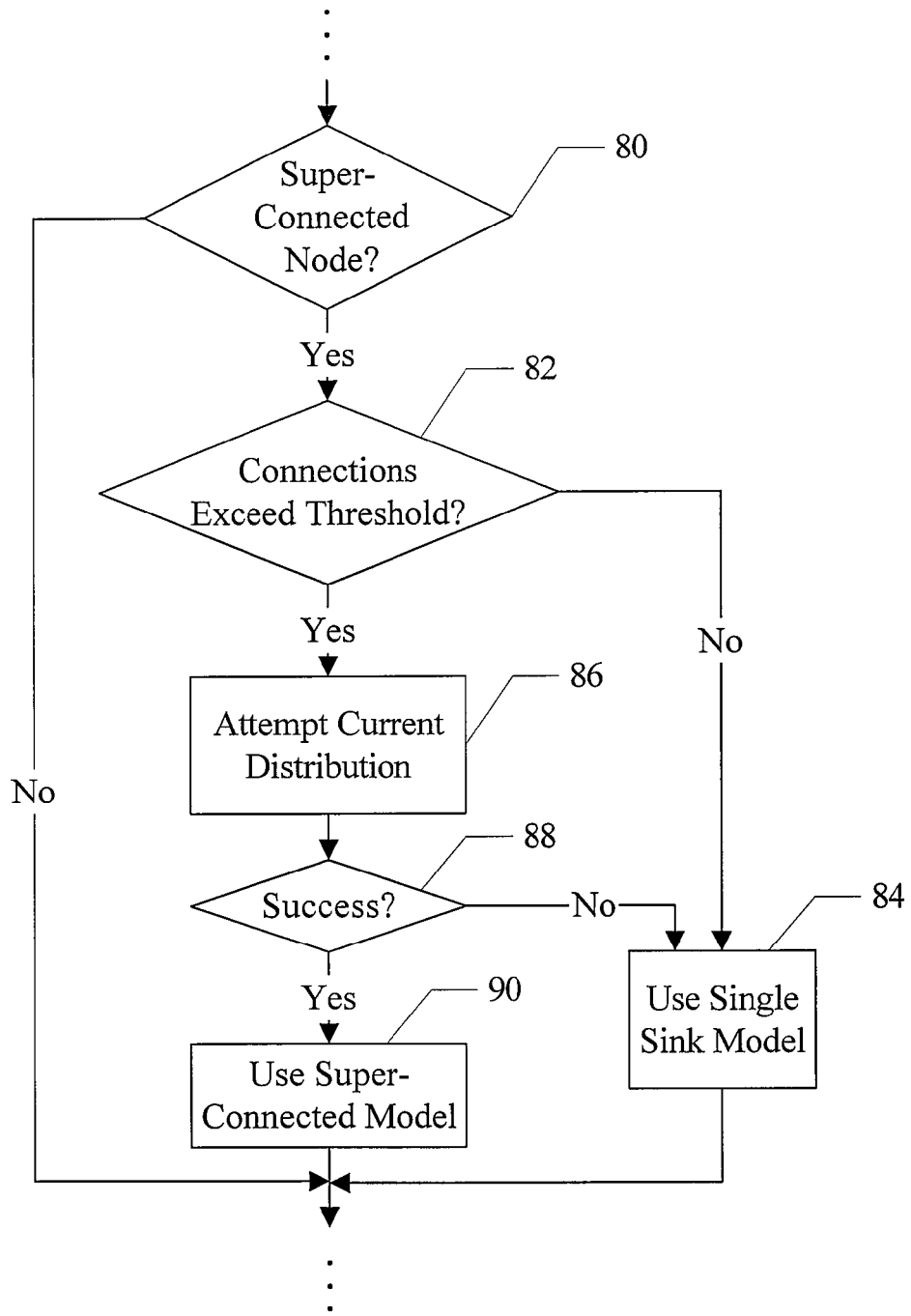
FIG. 12 is a flowchart illustrating a portion of the initialization illustrated in FIG. 7 for one embodiment.

FIG. 12 is a flowchart that may be part of the linear partition solver 20's response to the initialize command (e.g. part of the flowchart shown in FIG. 7). While the blocks are shown in a particular order for ease of understanding, other orders may be used. The linear partition solver 20 may include instructions which, when executed, implement the operation illustrated in FIG. 12.

If the linear partition solver 20 discovers a superconnected node in the partition (decision block 80, "yes" leg), the linear partition solver 20 may determine if the number of connections to the superconnected node exceeds a defined threshold (decision block 82). The determination is optional, and any superconnected node may be considered for using the superconnected model in other embodiments, independent of the number of connections. The determination may be used, e.g., if performance gained by using the superconnected node is offset by the performance lost in generating the superconnected model for fewer than the threshold number of connections, for example. The threshold may be programmable, and may be user-selectable, in some embodiments. If the number of connections is less than the threshold (decision block 82, "no" leg), the linear partition solver 20 may use the single sink model for the superconnected node (block 84). If the number of connections exceeds the threshold (decision block 82, "yes" leg), the linear partition solver 20 may attempt to determine a current distribution for the constituents within the superconnected constituent 74 (block 86). In some cases, the combination of constituents 12N, 12P, 12Q, and 12R may be complex and it may be difficult to determine the distribution. There may be combinations of loops or other feedback within and/or between the constituents 12N, 12P, 12Q, and 12R which are determined to be too complex to handle. In other cases, the attempt to determine the distribution may fail, or may fail to converge within a reasonable period of time. For such cases, the linear partition solver 20 may implement the single sink model (decision block 88, "no" leg and block 84). Otherwise, the superconnected model may be used (block 90).

Figure 13:
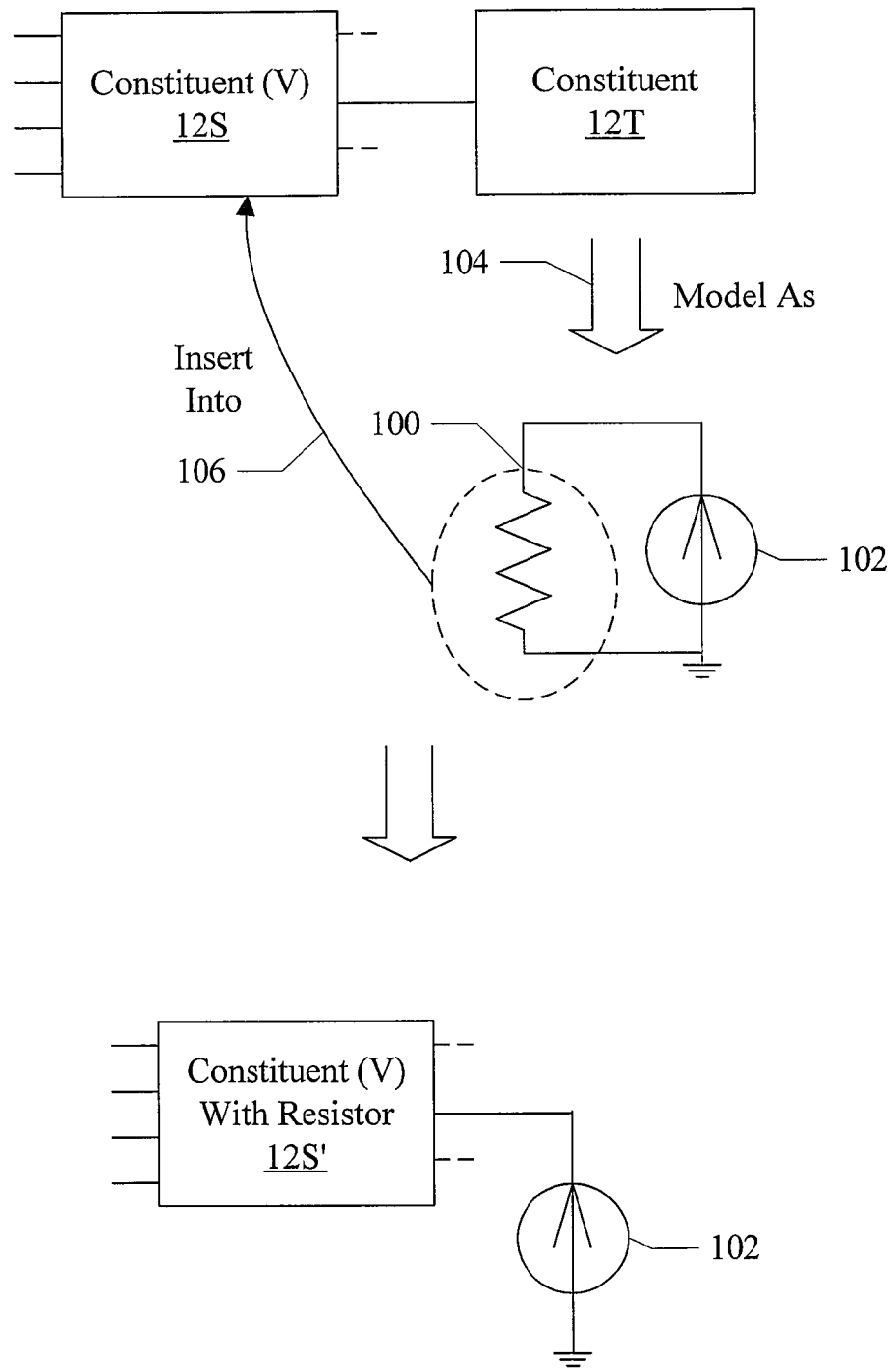
FIG. 13 is a block diagram illustrating one embodiment of a constituent having a single output to a non-variable constituent, and a modeling option for the circuit.

Another potential optimization that may be implemented in some embodiments is for the case of a constituent that has a single output that is in use and has a single sink which is a non-variable constituent. That is, the single output is an output of the constituent that has a connection to an input of a single non-variable constituent, and any other outputs, if they exist, are not connected. FIG. 13 is an example of such a constituent 12S, with a sink in non-variable constituent 12T, for one embodiment. The non-variable constituent 12T may be modeled as a resistance 100 in parallel with a current source 102 (arrow 104).

While the model of the resistance and current source may be relatively simple (and quick) to solve, the operations needed to access the model as a constituent (along with the attendant matrices) may dominate the performance of the evaluation. For the optimization, the resistance 100 may be inserted into the constituent 12S (arrow 106), leaving only the current source 102 external to the constituent 12S' that includes the resistor. In one embodiment, the solution matrix for the constituent 12S' may be created with an extra row and column reserved for the resistance, and the resistance may be inserted. In this fashion, the constituent 12T may be essentially removed from the partition, along with its solution and Z matrices. The constituent 12S' may be solved instead.

Figure 14:
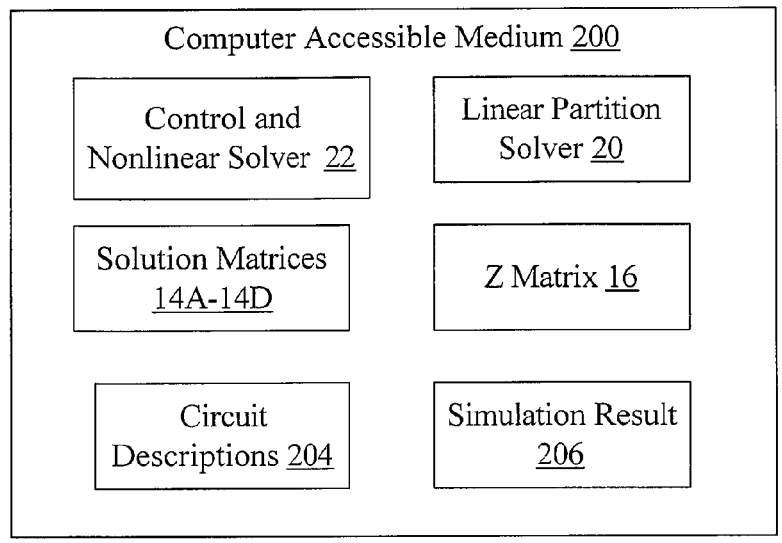
FIG. 14 is a block diagram of one embodiment of a computer accessible medium.

Turning now to FIG. 14, a block diagram of a computer accessible medium 200 is shown. Generally speaking, a computer accessible medium may include any media accessible by a computer during use to provide instructions and/or data to the computer. For example, a computer accessible medium may include storage media such as magnetic or optical media, e.g., disk (fixed or removable), tape, CD-ROM, or DVD-ROM, CD-R, CD-RW, DVD-R, DVD-RW, volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, etc., microelectromechanical systems (MEMS), etc. The media may be insertable into the computer, integrated into the computer (e.g. a fixed disk or RAM), or coupled to the computer via a communication medium such as a network and/or a wireless link. The computer accessible medium 200 in FIG. 14 may store one or more of the control and nonlinear solver module 22 and the linear partition solver module 20. The computer accessible medium 200 may further store one or more data structures such as the solution matrices for the constituents (e.g. matrices 14A-14D), the Z matrix 16, a circuit description or descriptions 204 (e.g. comprising one or more files), and a simulation result 206 (e.g. comprising one or more files). The control and nonlinear solver module 22 and the linear partition solver module 20 may comprise instructions which, when executed, implement the operation described herein for the respective software. Generally, the computer accessible medium 200 may store any set of instructions which, when executed, implement a portion or all of the flowcharts shown in one or more of FIGS. 6, 7, 8, 9, 10, and 12, and the operation illustrated FIG. 13. A carrier medium may include computer accessible storage media as well as transmission media such as wired or wireless transmission.

Figure 15:
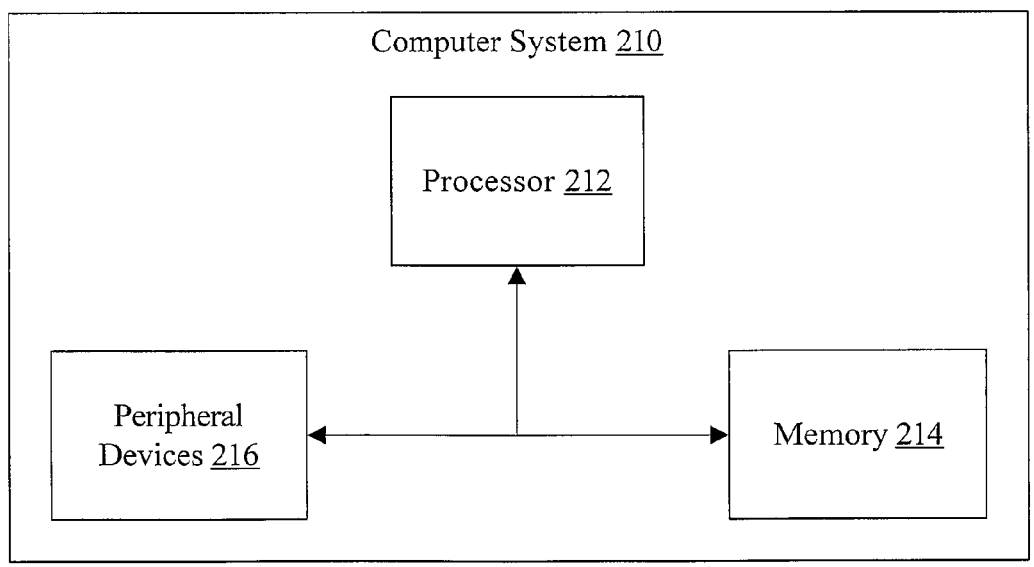
FIG. 15 is a block diagram of one embodiment of a computer system.

FIG. 15 is a block diagram of one embodiment of an exemplary computer system 210. In the embodiment of FIG. 10, the computer system 210 includes a processor 212, a memory 214, and various peripheral devices 216. The processor 212 is coupled to the memory 214 and the peripheral devices 216.

The processor 212 is configured to execute instructions, including the instructions in the software described herein. In various embodiments, the processor 212 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 210 may include more than one processor.

The processor 212 may be coupled to the memory 214 and the peripheral devices 216 in any desired fashion. For example, in some embodiments, the processor 212 may be coupled to the memory 214 and/or the peripheral devices 216 via various interconnect. Alternatively or in addition, one or more bridge chips may be used to couple the processor 212, the memory 214, and the peripheral devices 216, creating multiple connections between these components The memory 214 may comprise any type of memory system. For example, the memory 214 may comprise DRAM, and more particularly double data rate (DDR) SDRAM, RDRAM, etc. A memory controller may be included to interface to the memory 214, and/or the processor 212 may include a memory controller. The memory 214 may store the instructions to be executed by the processor 212 during use (including the instructions implementing the software described herein), data to be operated upon by the processor 212 during use (including the data structures described herein), etc.

Peripheral devices 216 may represent any sort of hardware devices that may be included in the computer system 210 or coupled thereto (e.g. storage devices, optionally including a computer accessible medium 200, other input/output (I/O) devices such as video hardware, audio hardware, user interface devices, networking hardware, etc.).

Numerous variations and modifications will become apparent to those skilled in the art once the above disclosure is fully appreciated. It is intended that the following claims be interpreted to embrace all such variations and modifications.

What is claimed is:

1. A method for simulating an electric circuit that is represented as one or more partitions, each partition comprising a plurality of constituents representing portions of the circuit, wherein at least one of the constituents is a variable constituent for which the corresponding portion of the electronic circuit includes non-linear behavior, the method comprising:
    determining a first matrix for the variable constituent, wherein the first matrix describes a system of equations that represents a behavior of the variable constituent;
    determining a second matrix for the partition, wherein the second matrix permits calculation of short circuit currents on each terminal of each constituent from open circuit voltages on the terminals according to a node tearing analysis method; and
    simulating a timestep of the simulation, the simulating comprising:
        iteratively solving a state of the partition using successive guesses of the state of the variable constituent, each iteration comprising solving the variable constituent independently to generate the open circuit voltages, applying the second matrix to determine the short circuit currents, and resolving the variable constituent with the short circuit currents applied and internal forcing functions of variable partition disabled;
        converging to a solution during the iteratively solving; and
        solving the state of the partition for the timestep responsive to the converging.

2. The method as recited in claim 1 wherein the variable constituent has a different model for a second timestep of the simulation, and wherein the method further comprises:
    determining a third matrix for the variable constituent, wherein the third matrix describes a system of equations that represents a behavior of the variable constituent in the second timestep; and
    determining a fourth matrix for the partition according to the node tearing analysis method, wherein the fourth matrix applies partition during the second timestep.

3. The method as recited in claim 1 wherein the determining the first matrix and the determining the second matrix is performed during initialization of the simulation, and wherein the first matrix and the second matrix are saved for use during the timestep of the simulation.

4. The method as recited in claim 1 wherein the plurality of constituents include a first constituent having a first terminal that is connected to terminals of two or more second constituents, the method further comprising:
    modeling the two or more second constituents as a first model having a second terminal connected to the first terminal;
    solving for current on the second terminal of the first model; and
    distributing the current to the two or more second constituents.

5. The method as recited in claim 4 further comprising analyzing the second constituents to determine the current distribution.

6. The method as recited in claim 1 wherein the plurality of constituents include a first constituent having a first terminal that is connected to terminals of two or more second constituents, the method further comprising:
    analyzing the second constituents to determine a current distribution among the second constituents from first terminal;
    detecting that the analyzing is unsuccessful; and
    modeling the first constituent and the second constituents with single sink connections between the first constituent and the second constituents.

7. The method as recited in claim 1 wherein the plurality of constituents include a first constituent having a first terminal that is connected to terminals of two or more second constituents, the method further comprising:
    determining that a number of the second constituents is less than a threshold number; and
    modeling the first constituent and the second constituents with single sink connections between the first constituent and the second constituents.

8. The method as recited in claim 1 wherein the plurality of constituents comprises a first constituent having a first terminal that is connected to a second single terminal of a single second constituent, wherein other terminals of the first constituent, if any, are unconnected, the method further comprising:
    modeling the second constituent as a resistance in parallel with a current source;
    inserting the resistance into the first constituent; and
    attaching the current source to the first terminal.

9. The method as recited in claim 8 wherein the second constituent is not a variable constituent.

10. The method as recited in claim 1 wherein solving the state of the partition comprises solving the plurality of constituents that are not variable.

11. A computer accessible storage medium storing a plurality of instructions which, when executed on a computer, cause the computer to perform simulation of an electric circuit that is represented as one or more partitions, each partition comprising a plurality of constituents representing portions of the circuit, wherein at least one of the constituents is a variable constituent for which the corresponding portion of the electronic circuit includes non-linear behavior, and wherein the plurality of instructions, when executed:
    determine a first matrix for the variable constituent, wherein the first matrix describes a system of equations that represents a behavior of the variable constituent;
    determine a second matrix for the partition, wherein the second matrix permits calculation of short circuit currents from open circuit voltages according to a node tearing analysis method; and
    simulate a timestep of the simulation, the simulating comprising:

iteratively solving a state of the partition using successive guesses of the state of the variable constituent, each iteration comprising solving the variable constituent independently to generate the open circuit voltages, applying the second matrix to determine the short circuit currents, and resolving the variable constituent with the short circuit currents applied and internal forcing functions disabled;

converging to a solution during the iteratively solving; and solving the state of the partition for the timestep responsive to the converging.

12. The computer accessible storage medium as recited in claim 11 wherein the variable constituent has a different model for a second timestep of the simulation, and wherein the plurality of instructions, when executed:

determine a third matrix for the variable constituent, wherein the third matrix describes a system of equations that represents a behavior of the variable constituent for the second timestep;

determine a fourth matrix for the partition according to the node tearing analysis method, wherein the fourth matrix applies to the partition during the second timestep.

13. The computer accessible storage medium as recited in claim 11 wherein the first matrix and the second matrix are determined during initialization of the simulation, and wherein the first matrix and the second matrix are saved for use during the timestep of the simulation.

14. The computer accessible storage medium as recited in claim 11 wherein the plurality of constituents include a first constituent having a first terminal that is connected to terminals of two or more second constituents, and wherein the plurality of instructions, when executed:

model the two or more second constituents as a first model having a second terminal connected to the first terminal;

solve for current on second terminal of the first model; and distribute the current to the two or more second constituents.

15. The computer accessible storage medium as recited in claim 14 wherein the plurality of instructions, when executed, analyze the second constituents to determine the current distribution.

16. The computer accessible storage medium as recited in claim 11 wherein the plurality of constituents include a first constituent having a first terminal that is connected to terminals of two or more second constituents, wherein the plurality of instructions, when executed:

analyze the second constituents to determine a current distribution among the second constituents from the first terminal;

detect that the analysis of the second constituents is unsuccessful; and model the first constituent and the second constituents with single sink connections between the first constituent and the second constituents.

17. The computer accessible storage medium as recited in claim 11 wherein the plurality of constituents include a first constituent having a first terminal that is connected to terminals of two or more second constituents, wherein the plurality of instructions, when executed:

determine that a number of the second constituents is less than a threshold number; and model the first constituent and the second constituents with single sink connections between the first constituent and the second constituents.

18. The computer accessible storage medium as recited in claim 11 wherein the plurality of constituents comprises a first constituent having a first terminal that is connected to a single second terminal of a single second constituent, wherein other outputs of the first constituent, if any, are unconnected, wherein the plurality of instructions, when executed:

model the second constituent as a resistance in parallel with a current source;

insert the resistance into the first constituent; and attach the current source to the first terminal.

19. The computer accessible storage medium as recited in claim 18 wherein the second constituent is not a variable constituent.

* * * * *